United States Patent
Barink et al.

(10) Patent No.: US 7,199,713 B2
(45) Date of Patent: Apr. 3, 2007

(54) HOMODYNE SINGLE MIXER RECEIVER AND METHOD THEREFOR

(75) Inventors: Bernard Barink, McKinney, TX (US); Gregory G. Havlicek, North Richland Hills, TX (US); Gary M. Bishop, Kegworth (GB); Loek J. d'Hont, Rotonda-West, FL (US)

(73) Assignee: Sirit Technologies, Inc., Mississauga, Ontario (CA)

( * ) Notice: Subject to any disclaimer, the term of this patent is extended or adjusted under 35 U.S.C. 154(b) by 137 days.

(21) Appl. No.: 10/992,966

(22) Filed: Nov. 19, 2004

(65) Prior Publication Data

US 2006/0109127 A1   May 25, 2006

(51) Int. Cl.
*G08B 13/14* (2006.01)

(52) U.S. Cl. .............. 340/572.1; 340/572.4; 340/10.1

(58) Field of Classification Search .......... 340/572.1, 340/572.4, 571, 568.1, 573.1, 539.11, 10.1, 340/825.49; 455/41, 41.2, 456.1; 375/329
See application file for complete search history.

(56) References Cited

U.S. PATENT DOCUMENTS

| | | | |
|---|---|---|---|
| 4,321,549 A | 3/1982 | Hansen | |
| 4,360,810 A | 11/1982 | Landt | |
| 4,739,328 A | 4/1988 | Koelle et al. | |
| 4,786,907 A | 11/1988 | Koelle | |
| 4,888,591 A | 12/1989 | Landt et al. | |
| 5,030,807 A | 7/1991 | Landt et al. | |
| 5,055,659 A | 10/1991 | Hendrick et al. | |
| 5,485,520 A | 1/1996 | Chaum et al. | |
| 6,107,910 A * | 8/2000 | Nysen | 340/10.1 |
| 6,501,807 B1 * | 12/2002 | Chieu et al. | 375/329 |
| 6,531,957 B1 | 3/2003 | Nysen | |
| 6,611,224 B1 | 8/2003 | Nysen et al. | |
| 6,639,509 B1 * | 10/2003 | Martinez | 340/10.4 |
| 6,686,830 B1 | 2/2004 | Schirtzer | |
| 6,717,516 B2 * | 4/2004 | Bridgelall | 340/572.1 |
| 6,812,824 B1 * | 11/2004 | Goldinger et al. | 340/10.1 |
| 7,039,359 B2 * | 5/2006 | Martinez | 455/41.2 |

OTHER PUBLICATIONS

International Search Report and Written Opinion of the International Searching Authority mailed Mar. 15, 2006 for PCT Application No. PCT/US2005/040848, 12 pages.

* cited by examiner

*Primary Examiner*—Van T. Trieu
(74) *Attorney, Agent, or Firm*—Haynes and Boone, LLP

(57) ABSTRACT

An RFID circuit comprises an RF carrier signal source, a hybrid coupled to the RF carrier signal source operable to generate an in-phase and a quadrature phase component of the RF carrier signal, a switch coupled to the hybrid operable to pass one of the in-phase and quadrature phase components of the RF carrier signal to its output, and a mixer coupled to the output of the switch operable to multiply one of the in-phase and quadrature phase component of the carrier signal and a received modulated carrier signal and generate a baseband signal.

29 Claims, 3 Drawing Sheets

HOMODYNE SINGLE MIXER RECEIVER AND METHOD THEREFOR

BACKGROUND

RFID or radio frequency identification technology has been used in a variety of commercial applications such as inventory tracking and highway toll tags. In general, a transceiver tag or transponder transmits stored data by backscattering varying amounts of an electromagnetic field generated by an RFID reader. The RFID tag may be a passive device that derives its electrical energy from the received electromagnetic field or may be an active device that incorporates its own power source. The backscattered energy is then read by the RFID reader and the data is extracted therefrom.

Several technical hurdles must be overcome in order to make RFID work. Typically, the backscattered energy from the RFID tag contains relatively low power and has a short range. There is also a tendency for the transmitted signal to leak into the received signal path in the reader, thus introducing noise. Neither the distance between the RFID tag and reader nor the phase relationship between the backscattered signal and the local oscillator in the reader is known. The RFID system must also function where the RFID tag has a non-zero rate of displacement and/or acceleration toward or away from the RFID reader. In toll road applications, for example, it is desirable to permit a RFID tag a speed of at least 100 mph.

Because the RFID reader's local oscillator frequency is identical to that of the carrier frequency, the receiver is a homodyne detector. In a homodyne receiver, more than a single detected channel is required to detect the backscattered signal's amplitude modulation envelope because signals nulls may be present depending on the signal phase relative to the phase of the local oscillator. These signal nulls have traditionally been overcome by using a second detector or mixer that is at a 90 degree phase shift from the first local oscillator. The output of the two mixers are usually combined in an image-reject configuration, or alternatively, by processing the signals in the digital domain. However, both solutions have proven to be undesirable.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
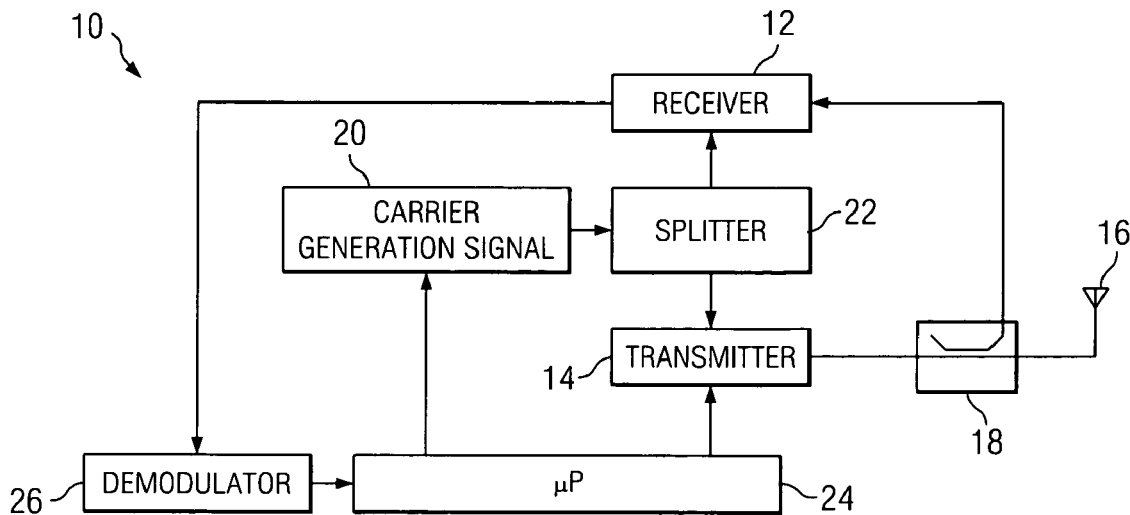
FIG. 1 is a simplified schematic diagram of an embodiment of a transceiver having a single mixer homodyne receiver and method therefor.

FIG. 1 is a simplified schematic diagram of an embodiment of a transceiver 10 having a single mixer homodyne receiver 12. Transceiver 10 also comprises a transmitter 14 coupled to an antenna 16 via a directional coupler 18. A carrier signal generator 20 is coupled to both receiver 12 and transmitter 14 via a signal splitter 22. A microprocessor or microcontroller 24 is coupled to transmitter 14 and carrier signal generator 20. A demodulator 26 such as an ASK (amplitude shift keying) demodulator is coupled to receiver 12 and microprocessor 24. An optional subcarrier demodulator may be coupled to ASK demodulator 26.

In operation, carrier signal generator 20 generates a radio frequency carrier signal that is combined with an information signal generated by the microcontroller 24. In particular, the transmission signal output from transmitter 14 includes the carrier signal modulated by the information signal. The transmission signal is radiated by antenna 16 to a transponder or RFID tag (not shown) located in proximity of transceiver 12. The RFID tag may be stationary or moving relative to the transceiver 12. The signal radiated back from the RFID tag in response to the transmitted signal is captured by antenna 16 and delivered to receiver 12. Receiver 12, having only one mixer, is nevertheless operable to mix the received signal with both the in-phase (I) and quadrature or 90° out-of-phase (Q) phase components of the locally-generated carrier signal to avoid signal nulls. The resultant baseband signal may be further demodulated by ASK demodulator 26 and the data extracted by microcontroller 24. Details of receiver 12 and operations thereof are described below with reference to FIGS. 2A and 2B.

Figure 2A:
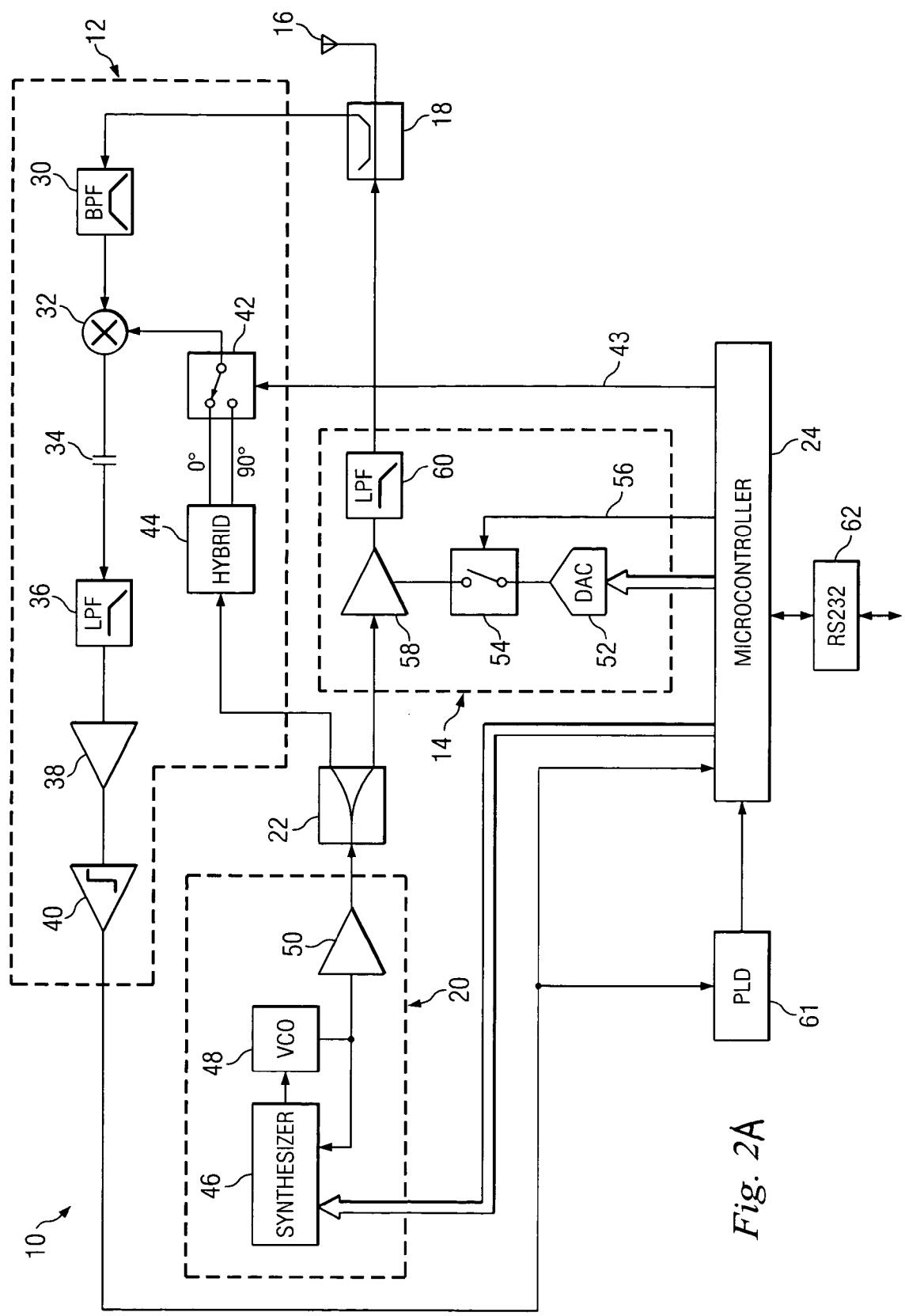
FIG. 2A is a more detailed circuit diagram of an embodiment of a transceiver with a single mixer homodyne receiver and method therefor.

FIG. 2A is a more detailed circuit diagram of an embodiment of transceiver 10. Transceiver 10 comprises a receiver 12 that may include a band-pass filter 30 that removes radio frequency signals and other signals not of interest outside a predetermined bandwidth. For example, band-pass filter 30 may only pass on low frequency (LF) signals in the 70 KHz to 350 KHz range or ultra high frequency signals (UHF) in the 850 MHz to 950 MHz range, depending on the desired application. Other frequencies are possible, the numbers here are merely an example. RFID technology also include readers and tags that operate in other radio frequency bands, such as high frequency (13.56 MHz) and microwave frequencies in the Gigahertz range as defined by the Electronic Product Code (EPC) standards. Instead of using a band-pass filter, receiver 12 may comprise one or more filter components to accomplish the same, such as using a low-pass filter and a high-pass filter in series, for example.

Receiver 12 further comprises a single mixer or multiplier 32 coupled to the output of band-pass filter 30 to receive the received modulated carrier signal from the RFID tag. Additional signal conditioning components are coupled to the output of mixer 32, such as a capacitor 34, a low-pass filter 36, an amplifier 38, and a limiter 40 are coupled in series to the output of mixer 32. Capacitor 34 is an AC coupling to remove DC components in the signal. A second input of mixer 32 is coupled to a two-position RF switch 42 controlled by a control signal 43 generated by microcontroller 24. Switch 42 is operable to pass to mixer 32 either the in-phase or the quadrature phase component of the carrier signal generated by carrier signal generator 20. Switch 42 is coupled to a hybrid 44 that generates the zero degree (in-phase) output and the 90 degree-shifted (quadrature) output of the carrier signal. Splitter 22 is used to convey the locally generated carrier signal to both the receiver and the transmitter portions of the transceiver.

Carrier signal generator 20 may comprise a synthesizer 46 coupled to a voltage-controlled oscillator (VCO) 48 and an amplifier 50. Carrier signal generator 20 is operable to generate the carrier signal that is then modulated with the information signal from microcontroller 24 for transmission to the RFID tag. The same carrier signal is also used to be mixed with the received signal to down-converted it to baseband.

Figure 2B:
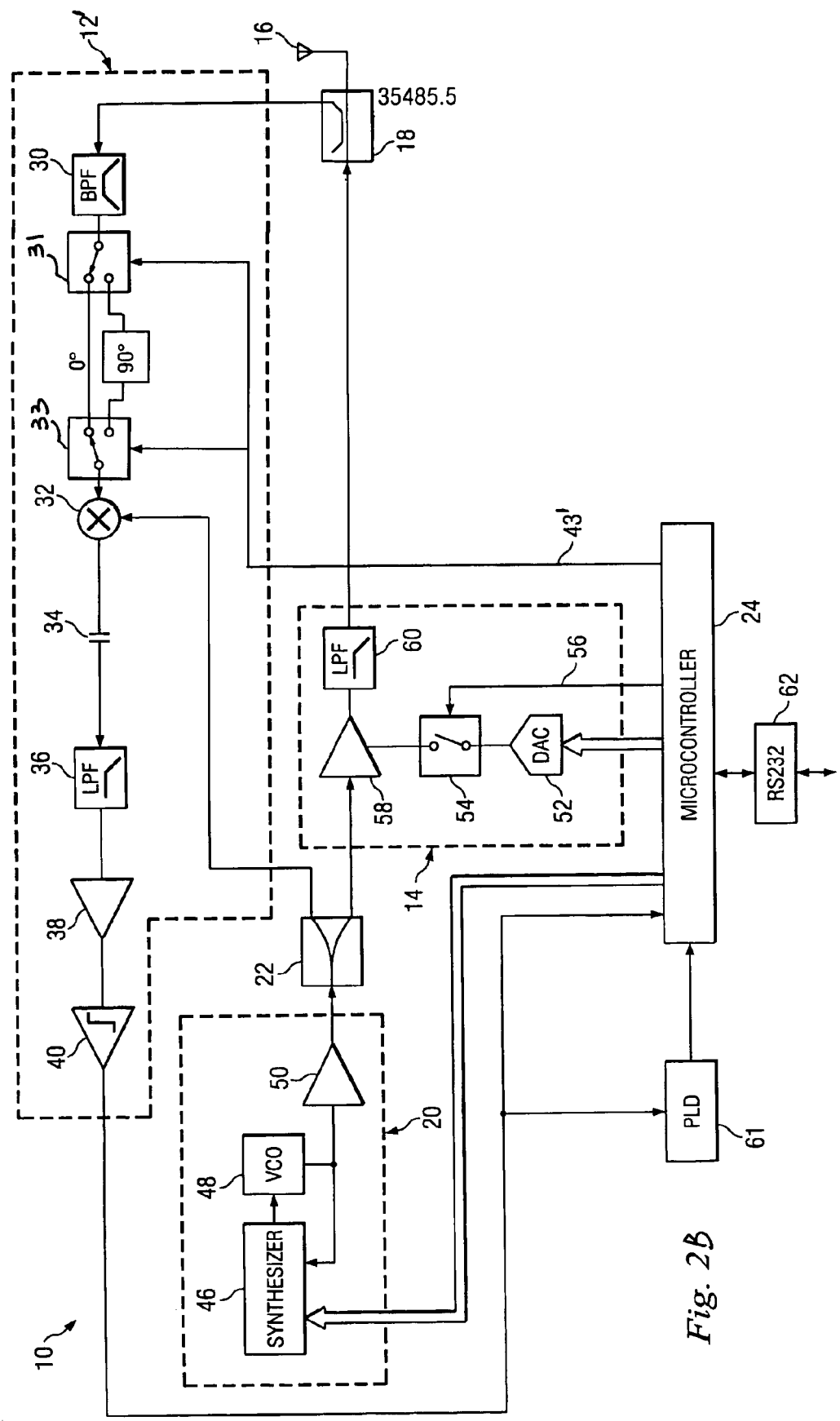
FIG. 2B is a more detailed circuit diagram of another embodiment of a transceiver with a single mixer homodyne receiver and method therefor; and and FIG. 3 is a simplified flowchart of an embodiment of a method for an RFID transceiver.

Referring now to FIG. 2B for another embodiment of receiver 12'. Receiver 12' also comprises a single mixer or multiplier 32 coupled to the output of band-pass filter 30 to receive the received modulated carrier signal from the RFID tag. However, a first RF switch 31 and a second RF switch 33 are coupled between filter 30 and mixer 32 to covey either the 0 degree or 90 degree phase component of the received modulated carrier signal from the RFID tag to the mixer. A control signal 43' from microcontroller 24 controls the toggle positions of switches 31 and 33. As before, additional signal conditioning components may be coupled to the output of mixer 32, such as a capacitor 34, a low-pass filter 36, an amplifier 38, and a limiter 40 are coupled in series to the output of mixer 32. Capacitor 34 is an AC coupling to remove DC components in the signal. Mixer 32 is coupled to splitter 22 which conveys the locally generated carrier signal to both the receiver and the transmitter portions of the transceiver.

Referring to both FIGS. 2A and 2B, transmitter 14 may comprise a digital-to-analog converter (DAC) 52 and a switch 54 controlled by a second control signal 56 from microcontroller 24. Second control signal 56 is a modulation control signal that is used to on-off key modulate the carrier signal in accordance with the information signal from microcontroller 24. In on-off key modulation, full amplitude corresponds to an ON or logical "one" state and zero amplitude corresponds to an OFF or logical "zero" state. Because each RFID tag polling cycle begins with a query, the transmission signal during the query is the carrier frequency modulated with the information signal. Subsequently when the backscattered signal from the RFID tag is down-converted to baseband, a non-modulated carrier signal is used in the mixer. An amplifier 58 is coupled to the output of switch 54 to modulate the carrier signal with the information signal and to amplify the modulated signal. A low-pass filter 60 attenuates the modulated signals that have high offset frequencies relative to the carrier signal. The output of low-pass filter 60 is provided to directional coupler 18 and antenna 16 for transmission. Details of the operations of the transceiver are set forth below with reference to FIG. 3.

Figure 3:
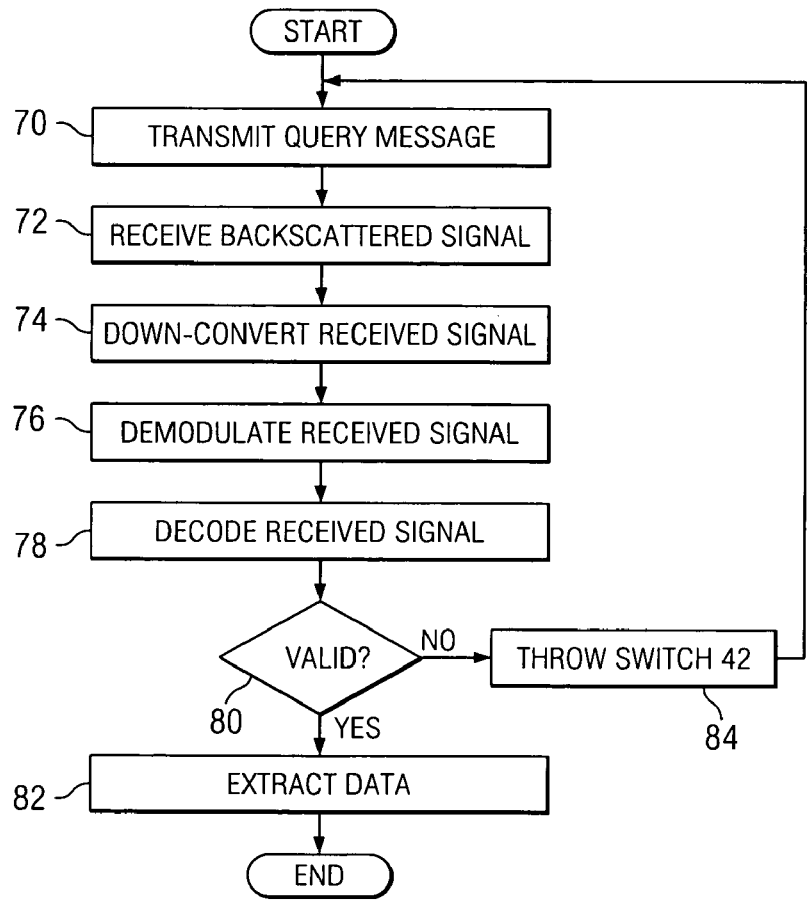

FIG. 3 is a simplified flowchart of an embodiment of a method for operating an RFID transceiver. At the beginning of a polling cycle in block 70, a query message is processed by transmitter 14 and transmitted by antenna 16. The query message is the carrier signal modulated according to the information signal from microcontroller 24. The carrier signal is generated in carrier signal generator 20. In response to the query message, an RFID tag or transponder transmits a reply message and antenna 16 captures the backscattered signal of the reply message in block 72. The reply message is directed to receiver 12 for processing. The received signal is properly filtered by band-pass filter 30 and/or other filtering components to removed unwanted signals and down-converted to baseband by using a single mixer 32 in block 74. Mixer 32 multiplies the carrier signal generated in carrier signal generator 20 and the received signal. Switch 42 passes alternately either the in-phase (0 degrees) or quadrature (90 degrees) phase component of the carrier signal to mixer 32 during each polling cycle. The baseband signal is further processed by filtering and amplification and is then demodulated by an ASK demodulator in block 76, which may be implemented by a programmable logic device (PLD) 61, for example. Depending on the particular transponder protocol, the ASK demodulator is sometimes followed by a subcarrier demodulator in the case of protocols that use a modulated subcarrier which would develop in the baseband. Such as subcarrier can be ASK, PSK or FSK modulated, or a combination of these. Alternatively, the demodulation task may be performed by software logic in microcontroller 24. The demodulated signal is then decoded by software logic microcontroller 24 in block 78. A determination is then made as to whether the decoded information is valid in block 80. This determination may be made a number of different ways, such as looking at the cyclic redundancy check (CRC), checksum or other error checking codes of the decoded signal. If the data is valid, then the data is extracted from the decoded signal in block 82. However, if the data is not valid, then microcontroller 24 issues control signal 43 to move switch 42 is to the other position in block 84 so that the next polling cycle will use the other phase component of the carrier signal to down-convert the received signal to baseband. For example, if in polling cycle N the in-phase phase component of the carrier signal is used to down-convert the received signal and the resultant data is not valid, then in polling cycle N+1, switch 42 is moved to coupled the quadrature phase component of the carrier signal to the mixer. The resultant decoded data in the N+1 polling cycle would be valid.

It is estimated that the single mixer would produce a strong enough output signal for about 80% of the presented phases. For RFID tags not at the outer reaches of the read range, the valid data percentage is more likely to be in the 95% range. Therefore, in only a small percentage of the time, a second polling cycle is needed to extract valid RFID tag data. For many applications, this is a minor and acceptable trade-off for a simplified single mixer transceiver circuit that results in significant cost savings.

As an alternative to the embodiment shown in FIG. 2A where the incoming receiver signal is mixed with both the in-phase (I) and quadrature or 90° out-of-phase (Q) phase components of the carrier signal, receiver 12' shown in FIG. 2B may comprise a single mixer 32 that mixes the carrier signal from a phase-fixed local oscillator and the incoming receiver signal toggled between 0 degrees and 90 degrees. This alternative embodiment is also operable to avoid signal nulls and other disadvantages associated with prior implementations.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. An REID circuit, comprising:
   an RF carrier signal source;
   a hybrid coupled to the RF carrier signal source operable to generate an in-phase and a quadrature phase component of the RF carrier signal;

a switch coupled to the hybrid operable to selectively pass only one of the in-phase and quadrature phase components of the RF carrier signal to its output; and a mixer coupled to the output of the switch operable to multiply the selectively passed one of the in-phase and quadrature phase components of the carrier signal and a received modulated carrier signal and generate a baseband signal.

2. The RFID circuit of claim 1, further comprising:
an information signal source;
a transmitter receiving the RF carrier signal and the information signal and operable to modulate the RF carrier signal according to the information signal; and
an antenna transmitting the modulated RF carrier signal.

3. The RFID circuit of claim 1, further comprising a splitter coupled to the RF carrier signal source and operable to pass the RF carrier signal to the hybrid and the transmitter.

4. The RFID circuit of claim 1, wherein the switch is operable to selectively pass only one of the in-phase and quadrature phase components of the RF carrier signal in alternate polling cycles.

5. The RFID circuit of claim 1, further comprising a filter to remove unwanted signals from the received modulated carrier signal.

6. The RFID circuit of claim 1, further comprising a bandpass filter receiving the received modulated carrier signal and passing RF signals within a predetermined bandwidth to the mixer.

7. An RFID circuit, comprising:
an RF carrier signal source;
a hybrid coupled to the RF carrier signal source operable to generate an in-phase and a quadrature phase component of the RF carrier signal;
an RF switch coupled to the hybrid operable to selectively pass only one of the in-phase and quadrature phase components of the RF carrier signal to its output;
a mixer coupled to the output of the switch operable to multiply the selectively passed one of the in-phase and quadrature phase component of the carrier signal and a received modulated carrier signal and generate a baseband signal; and
a processor operable to generate a control signal to the RF switch for selectively passing only one of the in-phase and quadrature phase components of the RF carrier signal to the mixer.

8. The RFID circuit of claim 7, further comprising:
a transmitter receiving the RF carrier signal and an information signal generated by the processor and operable to modulate the RF carrier signal according to the information signal; and
an antenna transmitting the modulated RF carrier signal.

9. The RFID circuit of claim 7, further comprising a splitter coupled to the RF carrier signal source and operable to pass the RF carrier signal to the hybrid and the transmitter.

10. The RFID circuit of claim 7, wherein the switch is operable to selectively pass only one of the in-phase and quadrature phase components of the RF carrier signal in alternate polling cycles.

11. The RFID circuit of claim 7, further comprising a filter to remove unwanted signals from the received modulated carrier signal.

12. The RFID circuit of claim 7, further comprising a bandpass filter receiving the received modulated carrier signal and passing RF signals within a predetermined bandwidth to the mixer.

13. The RFID circuit of claim 7, further comprising a demodulator operable to demodulate the received modulated carrier signal.

14. A circuit, comprising:
a carrier signal source;
a mixer operable to alternately multiply only a selected one of an in-phase and quadrature phase component of the carrier signal and a received modulated carrier signal to generate a baseband signal for demodulation and decoding.

15. The circuit of claim 14, further comprising:
a hybrid coupled to the carrier signal source operable to generate an in-phase and a quadrature phase component of the carrier signal;
a switch coupled to the hybrid operable to selectively pass only the selected one of the in-phase and quadrature phase components of the carrier signal to the mixer.

16. The RFID circuit of claim 14, further comprising:
an information signal source;
a transmitter receiving the carrier signal and the information signal and operable to modulate the carrier signal according to the information signal; and
an antenna transmitting the modulated carrier signal.

17. The RFID circuit of claim 16, further comprising a splitter coupled to the carrier signal source and operable to pass the RF carrier signal to the hybrid and the transmitter.

18. The RFID circuit of claim 14, wherein the switch is operable to selectively pass only the selected one of the in-phase and quadrature phase components of the RF carrier signal in alternate polling cycles.

19. The RFID circuit of claim 14, further comprising a filter to remove unwanted signals from the received modulated carrier signal.

20. A method comprising:
generating a carrier signal;
receiving a modulated carrier signal;
multiplying the modulated carrier signal and only an in-phase phase component of the carrier signal to generate a baseband signal;
demodulating the baseband signal;
decoding the demodulated baseband signal;
determining whether the decoded signal is valid; and
repeating the above steps and multiplying using only a quadrature phase component of the carrier signal to generate the baseband signal in response to the decoded signal being invalid.

21. The method of claim 20, further comprising:
generating an information signal;
modulating the carrier signal according to the information signal;
transmitting the carrier signal modulated according to the information signal; and
receiving the modulated carrier signal generated in response to the carrier signal modulated according to the information signal.

22. The method of claim 20, further comprising multiplying the modulated carrier signal and only the in-phase phase component of the carrier signal in one polling cycle, and multiplying the modulated carrier signal and only the quadrature phase component of the carrier signal in a next polling cycle in response to the decoded signal being invalid.

23. The method of claim 20, further comprising removing unwanted signals from the received modulated carrier signal.

24. The method of claim 20, further comprising examining an error-checking code of the decoded data to determine validity of the received modulated signal.

25. A method comprising:
generating a earner signal;
modulating the carrier signal and transmitting the modulated carrier signal;
receiving a backscattered modulated carrier signal;
multiplying the backscattered modulated carrier signal and only an in-phase phase component of the carrier signal to generate a baseband signal;
demodulating the baseband signal;
decoding the demodulated baseband signal;
determining validity of the decoded signal; and
in response to the decoded signal being invalid, repeating the above steps and multiplying the received backscattered modulated carrier signal using only a quadrature phase component of the carrier signal to generate a valid decoded signal.

26. A method comprising:
in a polling cycle:
 generating a carrier signal;
 modulating the carrier signal with an information signal and generating a query signal;
 receiving a backscattered modulated carrier signal in response to the query signal;
 multiplying the backscattered modulated carrier signal and only an in-phase phase component of the carrier signal and generating a baseband signal;
 demodulating the baseband signal;
 decoding the demodulated baseband signal;
 in response to an invalid decoded signal:
in a next polling cycle:
 generating the carrier signal;
 modulating the carrier signal with the information signal and generating a second query signal;
 receiving a second backscattered modulated carrier signal in response to the second query signal;
 multiplying the backscattered modulated carrier signal and only a quadrature phase component of the carrier signal and generating a second baseband signal;
 demodulating the second baseband signal; and
 decoding the demodulated second baseband signal and generating a valid decoded signal.

27. An RFID device comprising:
means for generating a carrier signal;
means for receiving a modulated carrier signal;
means for multiplying the modulated carrier signal and only an in-phase phase component of the carrier signal to generate a baseband signal;
means for demodulating the baseband signal;
means for decoding the demodulated baseband signal;
means for determining whether the decoded signal is valid; and
means for repeating the above steps and multiplying using only a quadrature phase component of the carrier signal to generate the baseband signal in response to the decoded signal being invalid.

28. A method comprising:
generating a carrier signal;
receiving a modulated carrier signal;
generating an in-phase component of the received modulated carrier signal;
multiplying only the modulated received in-phase component of the carrier signal and the carrier signal to generate a baseband signal;
demodulating the baseband signal;
decoding the demodulated baseband signal;
repeating the above steps and multiplying using only a quadrature phase component of the received modulated carrier signal to generate the baseband signal in response to the decoded signal being invalid.

29. The method of claim 28, further comprising multiplying only the modulated received in-phase component of the carrier signal and the carrier signal in one polling cycle, and multiplying only the modulated received quadrature phase component of the carrier signal and the carrier signal in a next polling cycle in response to the decoded signal being invalid.

* * * * *

UNITED STATES PATENT AND TRADEMARK OFFICE
CERTIFICATE OF CORRECTION

| | |
|---|---|
| PATENT NO. | : 7,199,713 B2 |
| APPLICATION NO. | : 10/992966 |
| DATED | : April 3, 2007 |
| INVENTOR(S) | : Bernard Barink et al. |

It is certified that error appears in the above-identified patent and that said Letters Patent is hereby corrected as shown below:

In column 4, claim 1, line 63 – replace "REID" with -- RFID --

In column 5, claim 3, line 15 – replace "claim 1" with -- claim 2 --

In column 7, claim 25, line 2 – replace "earner" with -- carrier --

Signed and Sealed this

Fourth Day of December, 2007

JON W. DUDAS
*Director of the United States Patent and Trademark Office*